(12) United States Patent
Momiyama et al.

(10) Patent No.: US 6,493,236 B1
(45) Date of Patent: Dec. 10, 2002

(54) ELECTRONIC EQUIPMENT

(75) Inventors: Hiroaki Momiyama, Kanagawa (JP); Takao Mokutani, Shizuoka (JP)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 10/135,176

(22) Filed: Apr. 29, 2002

(30) Foreign Application Priority Data

May 29, 2001 (JP) ........................................ 2001-161182

(51) Int. Cl.$^7$ ................................................ H05K 5/00
(52) U.S. Cl. ........................ 361/756; 361/725; 361/726; 361/727; 361/740; 361/754; 361/759; 361/801; 361/802; 361/741
(58) Field of Search .............................. 361/728, 752, 361/754, 796, 797, 798, 801, 726, 732, 740, 747, 759, 802, 741, 756, 685, 724, 725, 727, 735, 739, 755, 787–790, 807, 809, 810; 174/50.52, 50; 206/706; 439/325–328, 64, 377; 312/223.1, 223.2; 211/4.17, 26.2

(56) References Cited

U.S. PATENT DOCUMENTS 3,640,399 A * 2/1972 Hartman .................. 211/41.17
4,184,599 A * 1/1980 Drake et al. .............. 211/41.17
6,201,703 B1 * 3/2001 Yamada et al. ............. 361/752

FOREIGN PATENT DOCUMENTS

| JP | 05-343870 | 12/1993 |
| JP | 10-13061 | 1/1998 |
| JP | 10-135671 | 5/1998 |

* cited by examiner

Primary Examiner—David Martin
Assistant Examiner—Phuong T. Vu
(74) Attorney, Agent, or Firm—Katten Muchin Zavis Rosenman (57) ABSTRACT

An electronic equipment enclosure has a lower housing part and a main board fixed relative thereto. A main board connector is fixed to the main board and faces the lower housing part. A sub board is inserted to a temporary attachment position within the lower housing part and faces the main board at the temporary attachment position. A sub board connector is fixed relative to the sub board and mates and connects with the main board connector. A guide rail is movable freely between a lower position and an upper position within the lower housing part. At the lower position the guide rail guides the sub board toward the temporary attachment position. By the guide rail moving from the lower position to the upper position, the sub board is caused to move from the temporary attachment position to the fully attached position.

7 Claims, 11 Drawing Sheets

FIG. 15

ELECTRONIC EQUIPMENT

BACKGROUND OF THE INVENTION

1. Field of the Invention

The present invention relates to an electronic equipment which has main board and a sub board.

2. Description of the Related Art

With regard to a piece of electronic equipment having a main board and a sub board installed within an enclosure, there are diverse arrangements of the main board and sub board relative to the enclosure.

SUMMARY OF THE INVENTION

However, in a case in which main and sub boards are disposed substantially in parallel and a connector is provided on the surfaces of each board facing one another, the sub board being pressed toward the main board so as to mate the connectors together, because of the strong pressing force that is required, the mating is difficult. Additionally, because a large pulling force is required to remove the sub board from the main board for maintenance and the like, this task is also difficult.

Accordingly, it is an object of the present invention, in consideration of the above-noted drawbacks in the conventional art, to improve the ease of insertion and removal of a sub board disposed substantially parallel to a main board.

In order to achieve the above-noted object, an electronic equipment according to the present invention has an enclosure, a first connection part, a sub board, a second connection part, a guide, and a guide movement mechanism.

The enclosure is partitioned into a sub board housing part having at least one aperture. The main board is fixed relative to the enclosure. The first connection part is fixed to the main board, and faces the sub board housing part. The sub board is inserted from the aperture toward a temporary attachment position, and at the temporary attachment position is disposed opposite the main board. The second connection part is fixed relative to the sub board and, by the sub board at the temporary attachment position moving toward the main board and reaching a fully attached position, mates with and connects to the first connection part. The guide is provided so as to freely move between a first position and a second position of the sub board. The guide at the first position guides the sub board to the temporary attachment position. The guide, by moving from the first position to the second position, causes the sub board to move from the temporary attachment position to the fully attached position, and holds the sub board at the fully attached position. A guide movement mechanism is linked to the guide and, by a driving operation, causes the guide to move from the first position to the second position.

In the above-described arrangement, when the sub board is to be installed, the guide is set at the first position and the sub board is inserted toward the temporary attachment position within the sub board housing part via the aperture of the enclosure. At the temporary attachment position, the sub board is in mutual opposition with the main board.

Once the sub board reaches the temporary attachment position, the guide movement mechanism is driven, so that the guide is caused to move from the first position to the second position. By doing this the sub board at the temporary attachment position moves toward the sub board and reaches the fully attached position, so that the second connection part and first connection part are mutually connected. In this connection the sub board is held and maintained at the fully attached position.

When the sub board is to be removed, the guide movement mechanism is driven and the sub board is pulled out along the guide and exposed from the aperture and, if necessary, the sub board is completely removed from the guide.

That is, the insertion and removal of the sub board relative to the sub board housing part is performed simply, by causing the sub board to move along the guide. The insertion and removal of the sub board relative to the main board in the sub board housing part is performed easily by driving the guide movement mechanism so as to cause the sub board to move. It is therefore possible to easily perform the tasks of inserting and removing the sub board.

DETAILED DESCRIPTION OF THE PREFERRED EMBODIMENTS

An embodiment of the present invention is described below, with references made to accompanying drawings.

Figure 1:
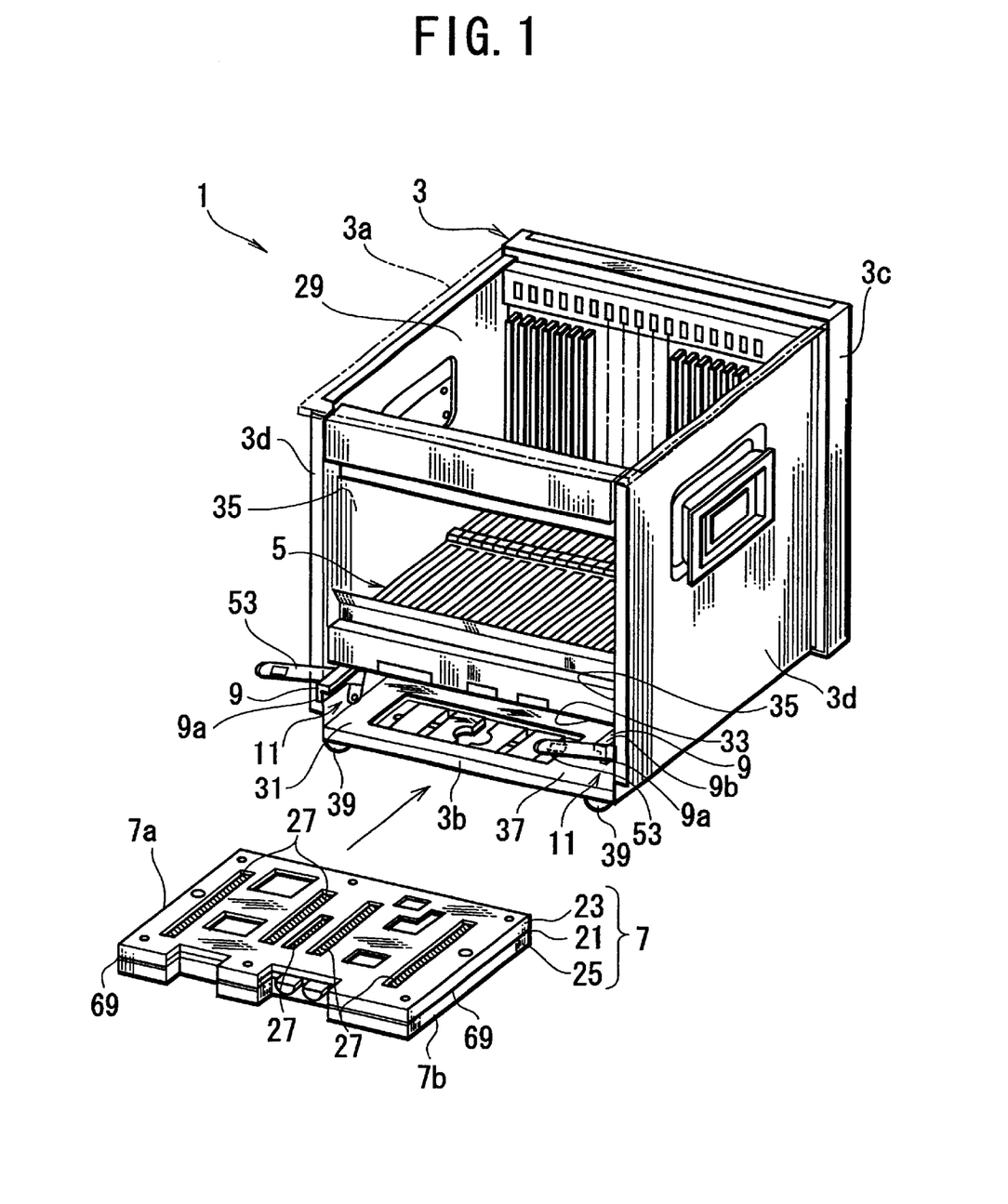
FIG. 1 is an outer oblique view from the frontal direction of a electronic equipment according to the present invention.
Figure 2:
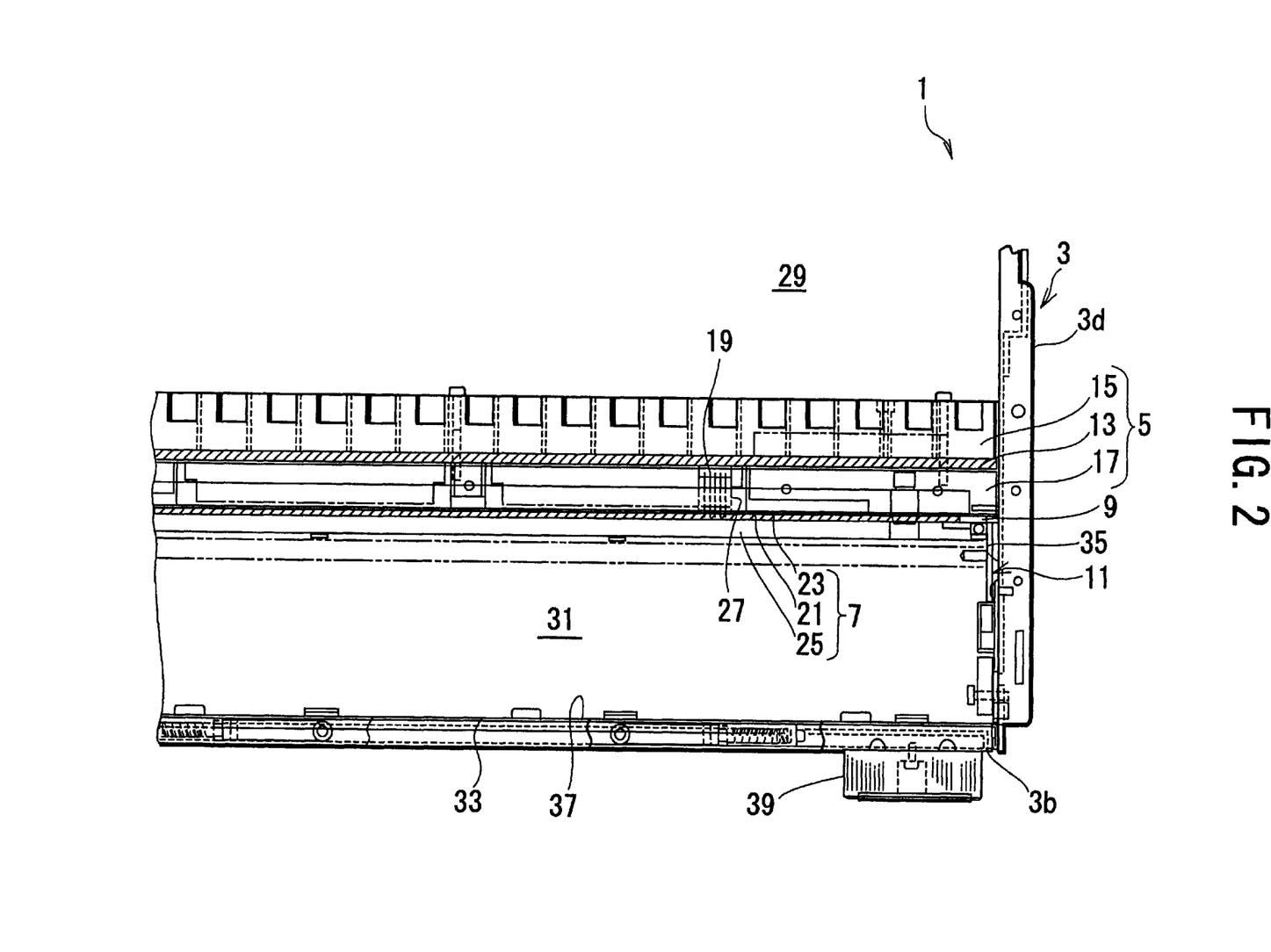
FIG. 2 is a front elevation of the main parts of the electronic equipment of FIG. 1.
Figure 3:
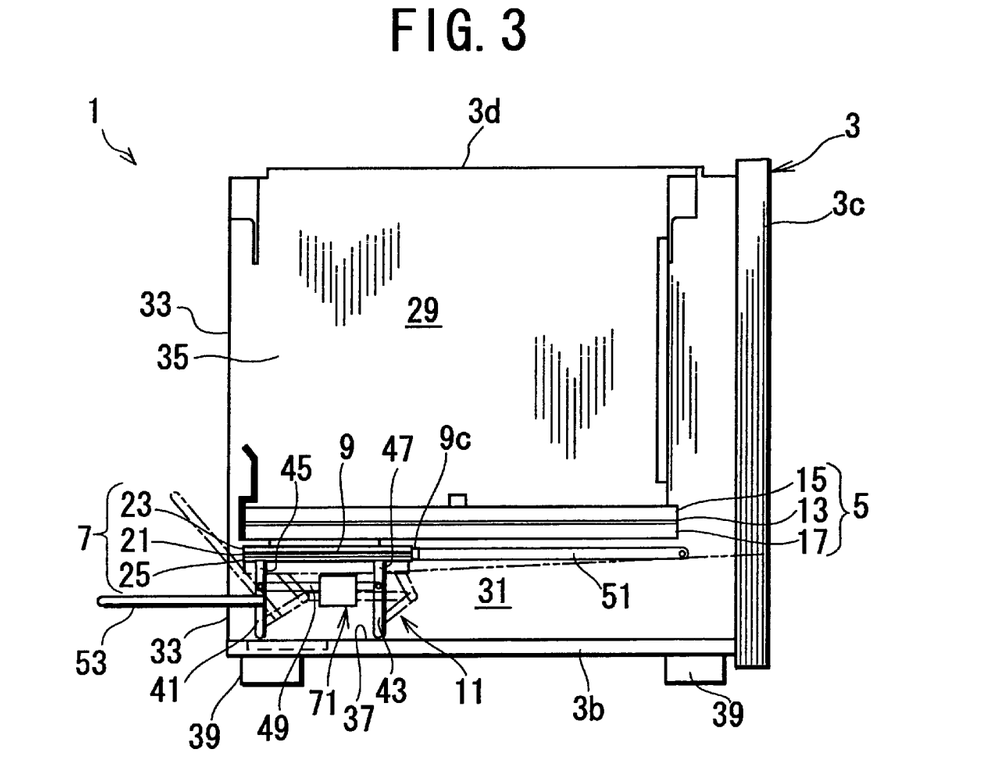
FIG. 3 is a side elevation showing the inside part of the electronic equipment of FIG. 1.
Figure 4:
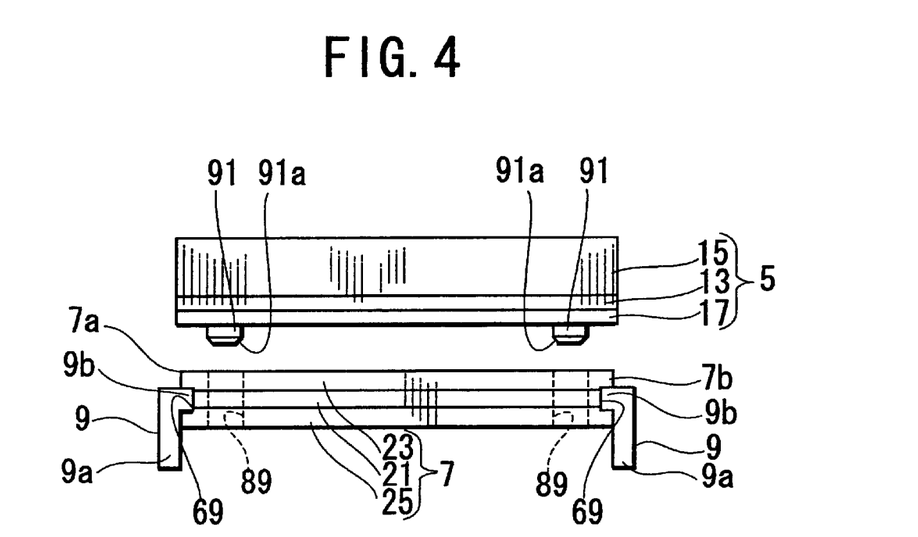
FIG. 4 is a front elevation showing the guide rail, the sub board block, and the main board block.
Figure 5:
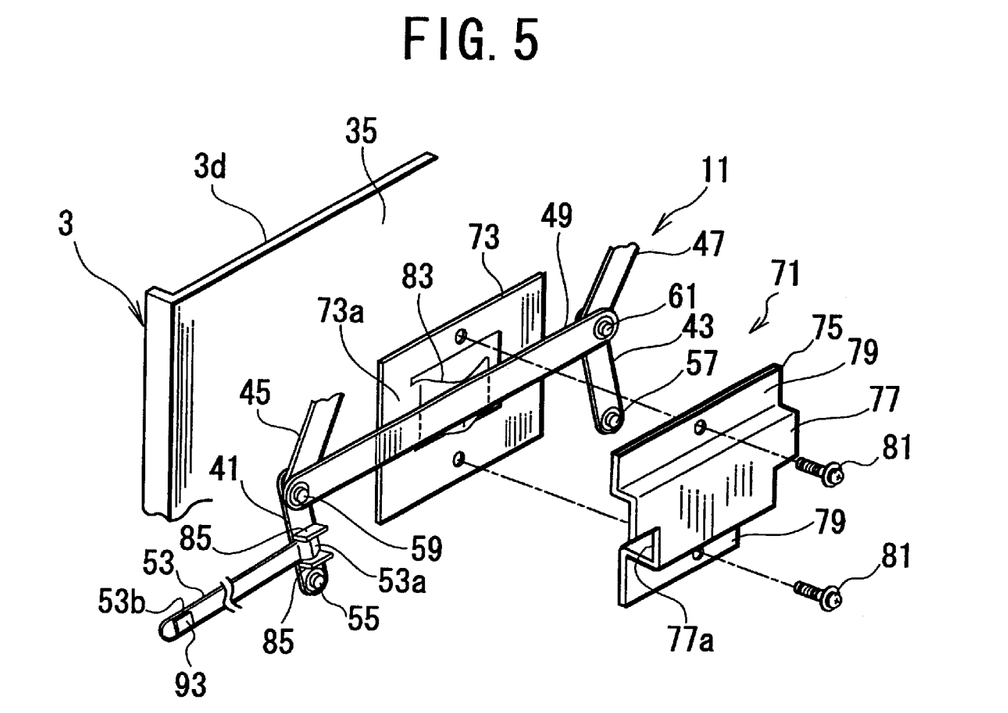
FIG. 5 is an exploded oblique view of a link restricting mechanism.
Figure 6:
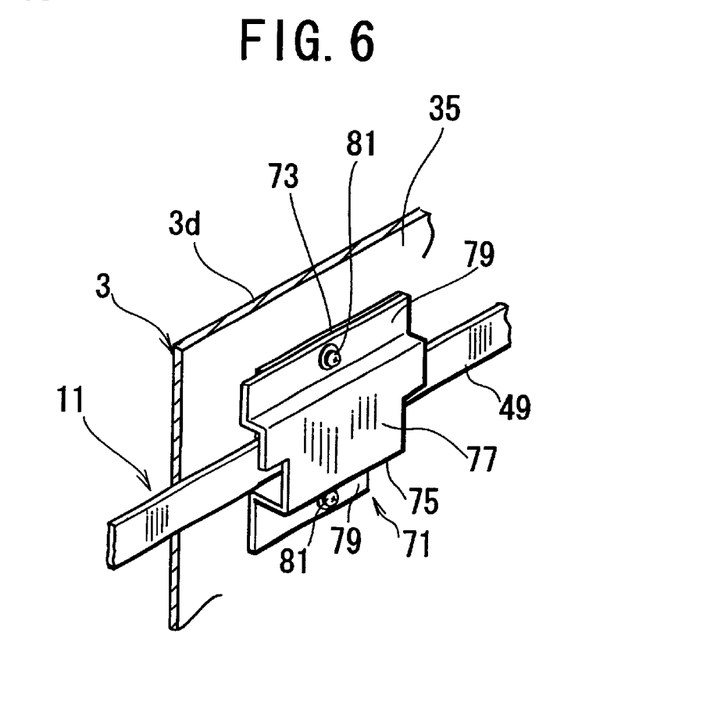
FIG. 6 is an outer oblique view of a link restricting mechanism.
Figure 7:
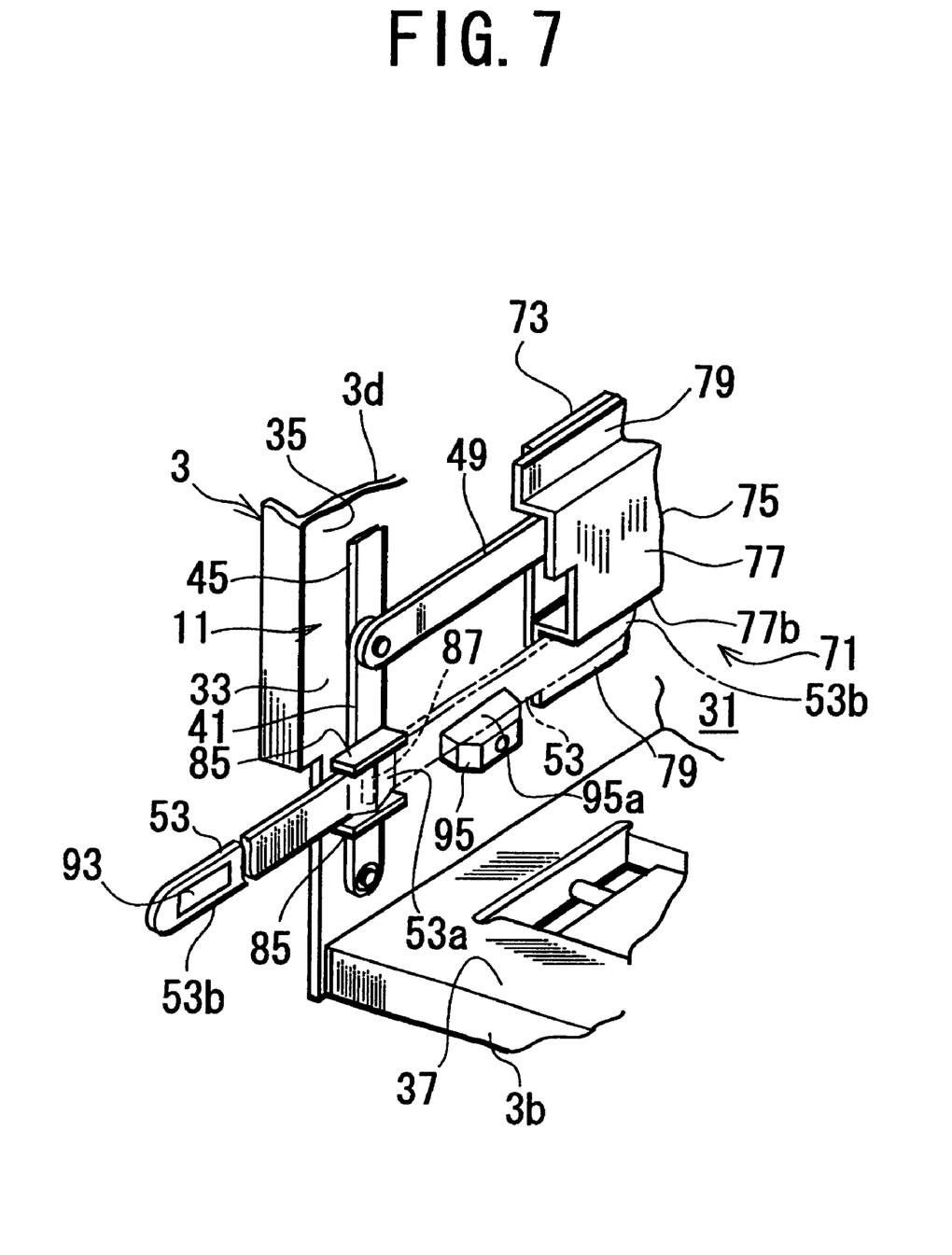
FIG. 7 is an oblique view of the main part of a link mechanism.
Figure 8:
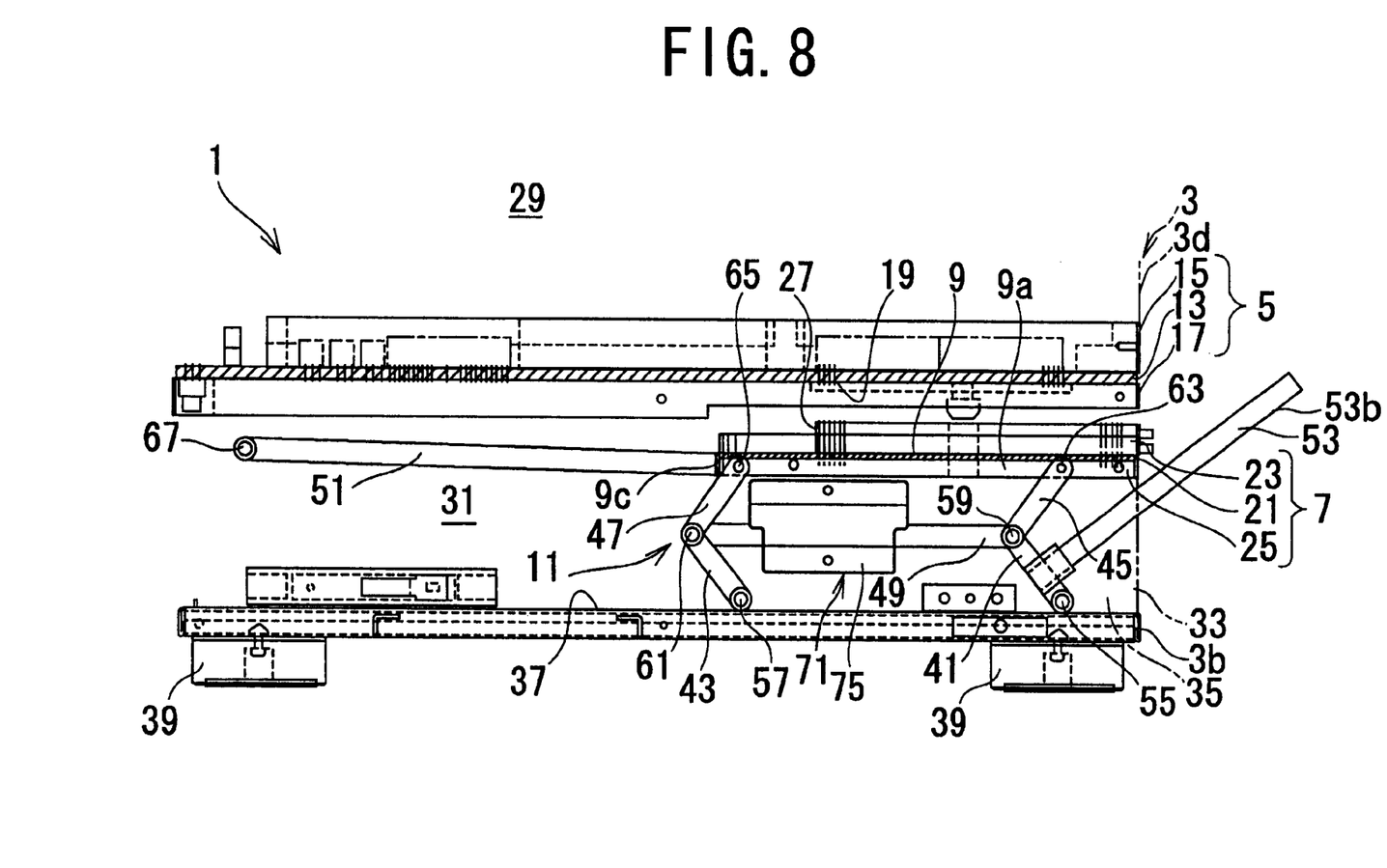
FIG. 8 is a side elevation showing the link mechanism when the guide rail is at a lower position.
Figure 9:
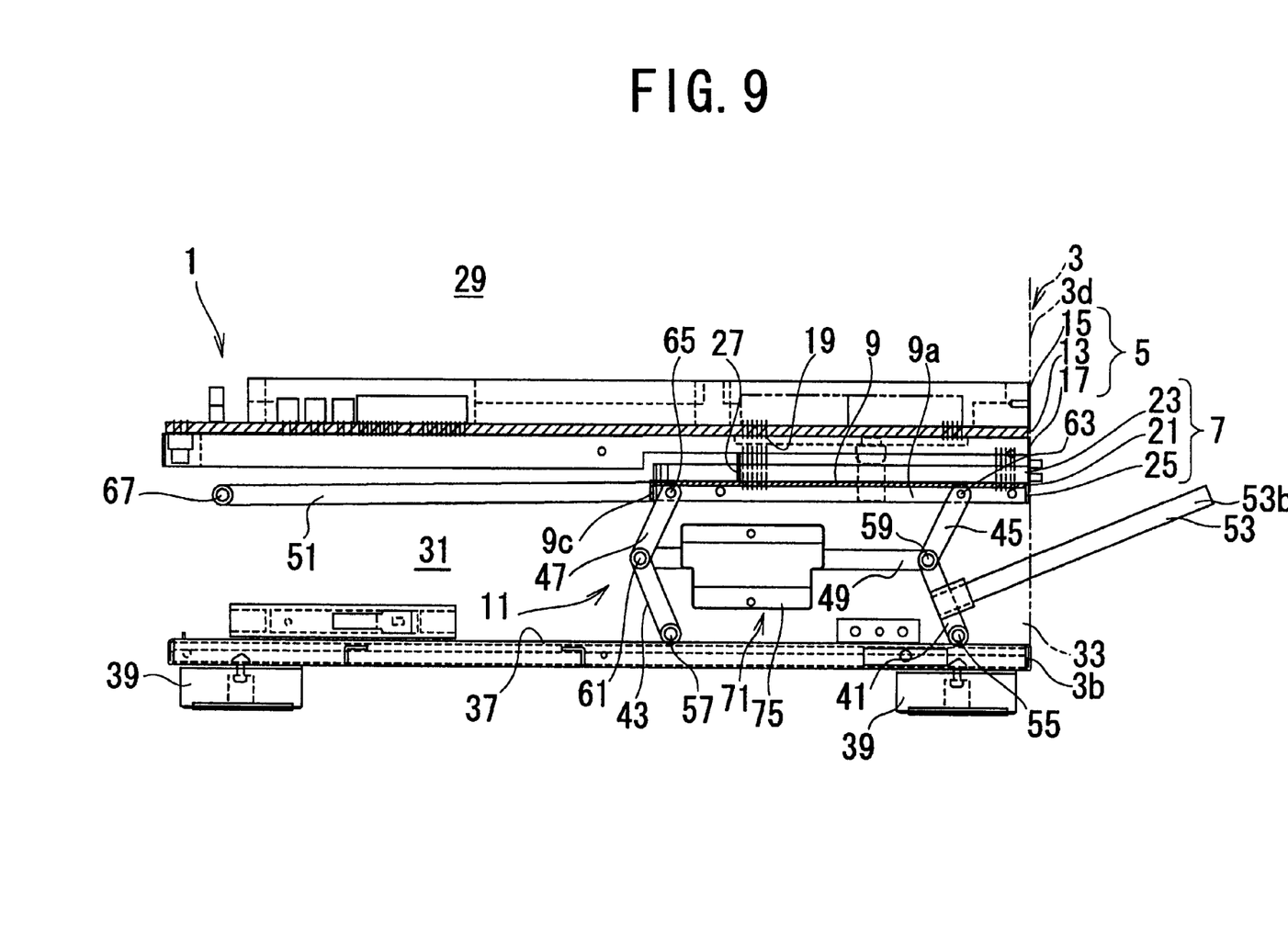
FIG. 9 is a side elevation showing the link mechanism when the guide rail is at a middle position.
Figure 10:
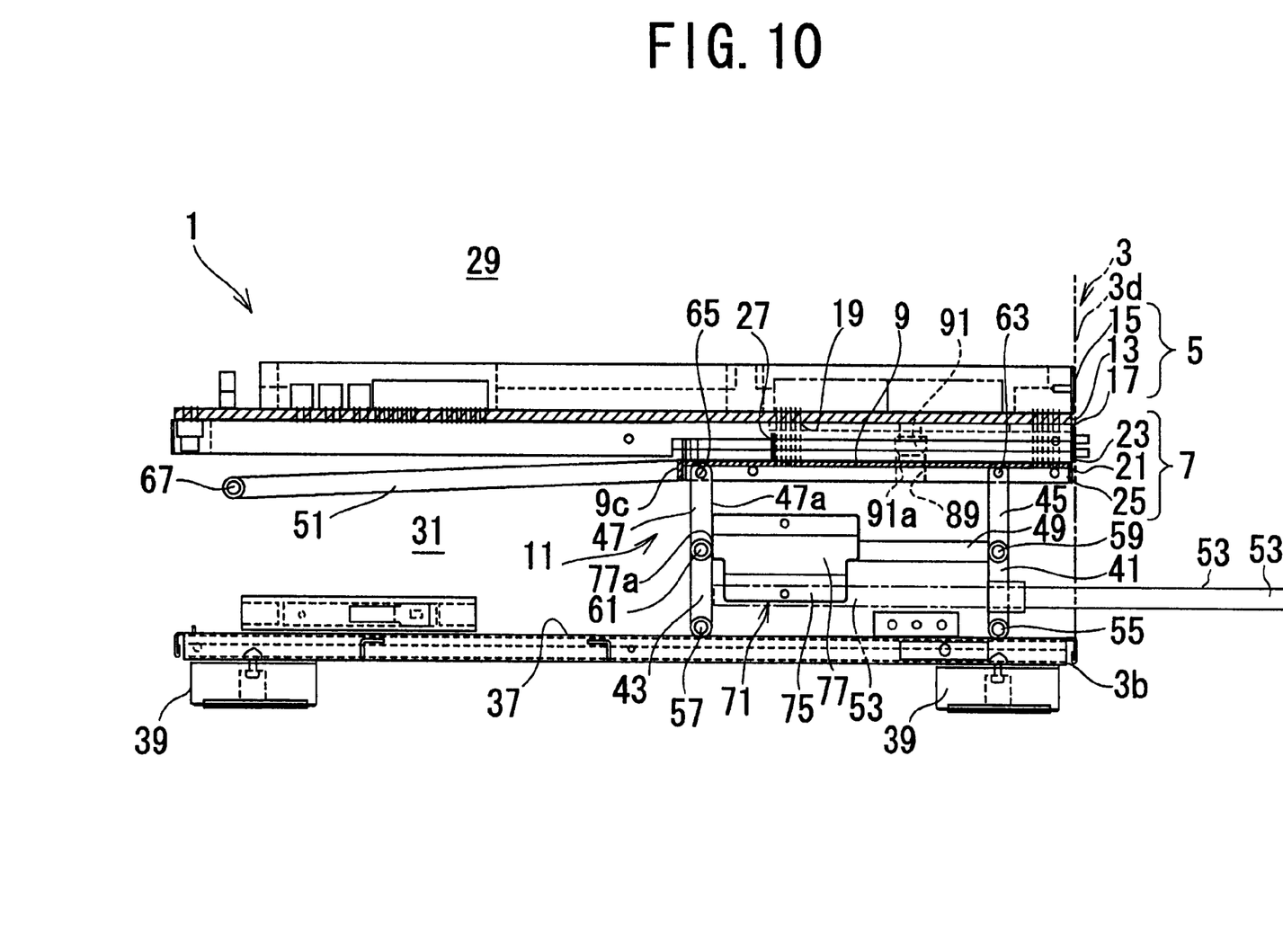
FIG. 10 is a side elevation showing the link mechanism when the guide rail is at an upper position.
Figure 11:
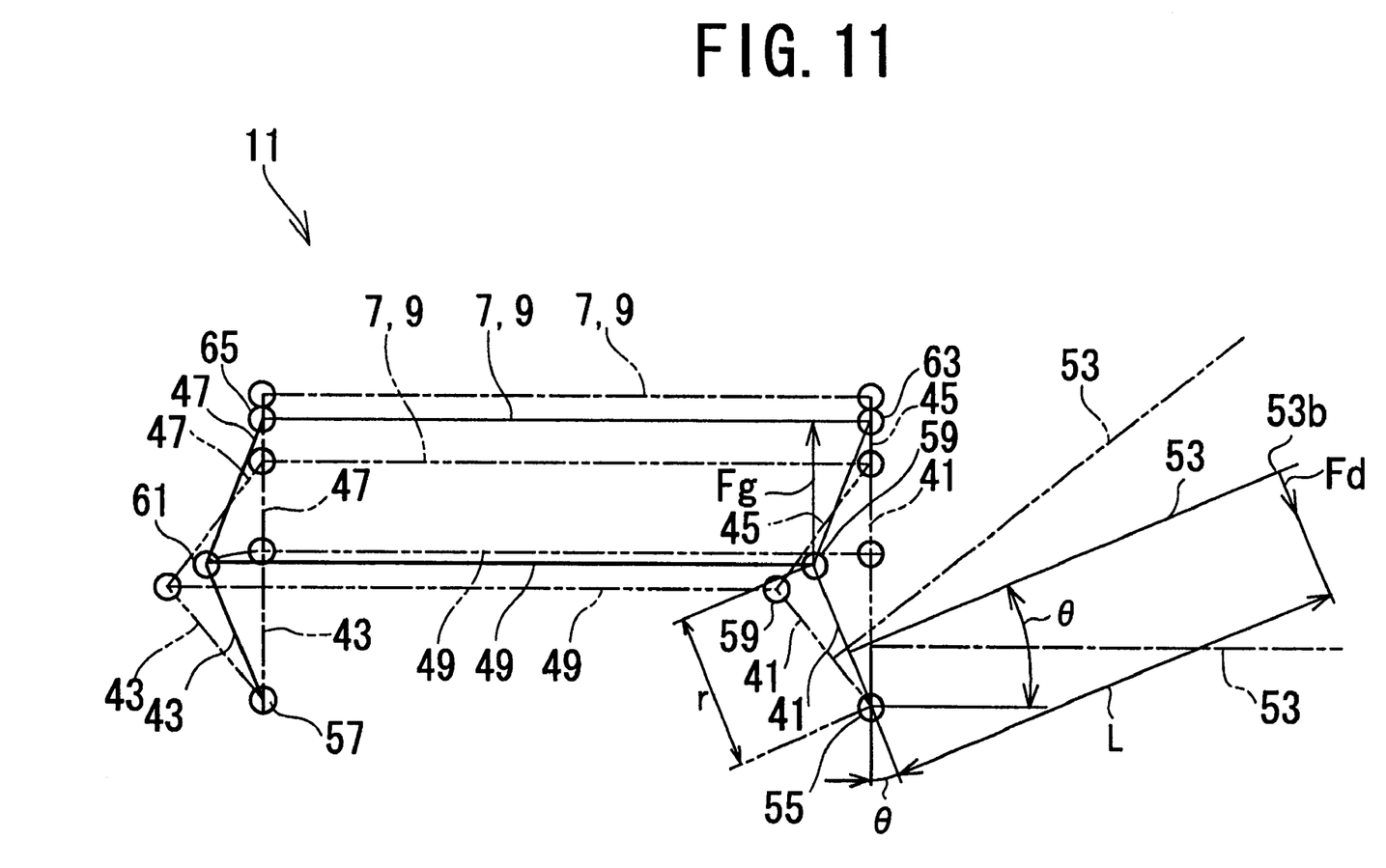
FIG. 11 is a schematic representation of an auxiliary insertion mechanism.
Figure 12:
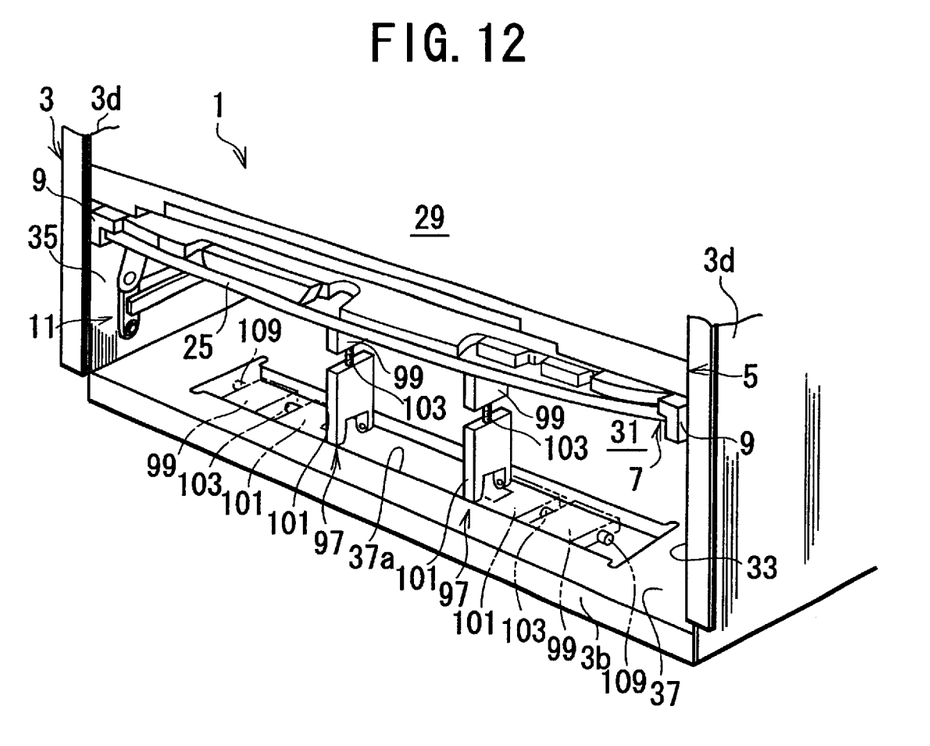
FIG. 12 is a noblique view showing the auxiliary insertion mechanism in use.
Figure 13:
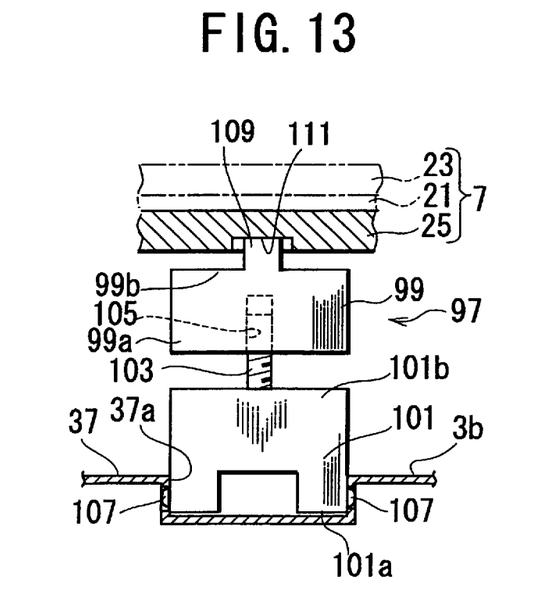
FIG. 13 is a front elevation showing the auxiliary insertion mechanism.
Figure 14:
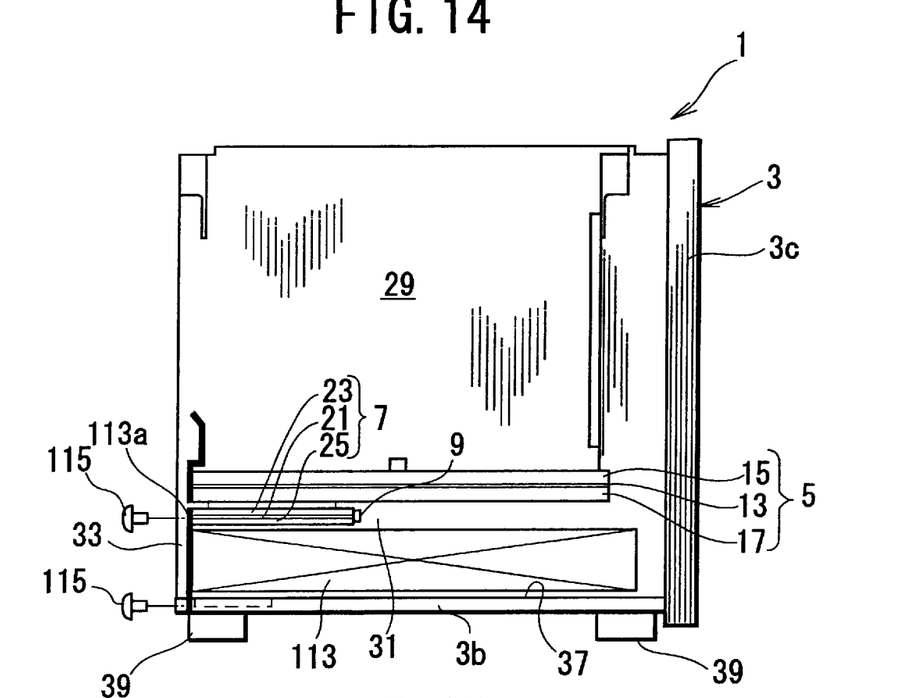
FIG. 14 is a side elevation showing the inside of an electronic equipment in which a power supply unit is housed inside the enclosure.
Figure 15:
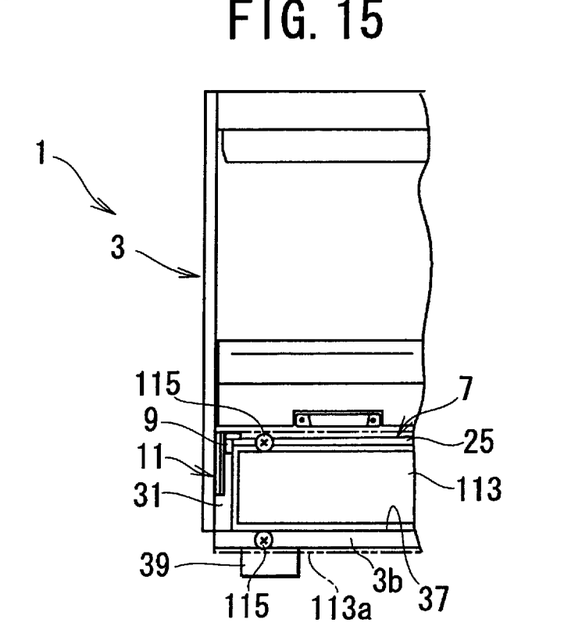
FIG. 15 is a front view of FIG. 14.

FIG. 1 is an overall oblique view of an electronic equipment according to the present invention, FIG. 2 is a front elevation of the main part of the electronic equipment, FIG. 3 is a side elevation showing the inside part of the electronic equipment, FIG. 4 is a front elevation showing the sub board bloc, and the main board block, FIG. 5 is an exploded oblique view of the link restricting mechanism, FIG. 6 is an outer oblique view of the link restricting mechanism, FIG. 7 is an oblique view of the main part of the link restricting mechanism, FIG. 8 through FIG. 10 are side elevations showing the operating conditions of the link mechanism, FIG. 11 is a schematic representation of the link mechanism, FIG. 12 is an oblique view showing the auxiliary insertion mechanism in use, FIG. 13 is a front elevation of the auxiliary insertion mechanism, FIG. 14 is a side elevation showing the inside of an electronic equipment in which a power supply unit is housed inside the enclosure, and FIG. 15 is a front view of FIG. 14.

Configuration of the Electronic Equipment

As shown in FIG. 1, the electronic equipment according to this embodiment of the present invention has an enclosure 3, a main board block 5, a sub board block 7, a pair of guide rails 9 as a guide, and a pair link mechanisms 11 as a guide movement mechanism.

As shown in FIG. 2, the main board block 5 is formed by a main board 13, and an upper reinforcement plate 15 and lower reinforcement plate 17 acting as third and fourth reinforcement plates 3 and 4, which fit around the top and bottom surfaces of the main board 13 to surround the main board 13. A plurality of main board connectors 19 acting as first connection parts are provided on the lower surface of the main board 13. The main board connectors 19 have female terminals which mate with the male terminals (not shown in the drawing) of the sub board connectors 27 to be described below, and make electrical connection therewith.

As shown in FIG. 1, the sub board block 7 is made up of a sub board 21, and upper and lower reinforcement plates 23 and 25, which act as first and second reinforcement plates so surround the sub board 21 from the upper and lower surfaces thereof. A plurality of sub board connectors 27 acting as second connection parts are provided on the upper surface of the sub board 21 in correspondence with the plurality of main board connectors 19. Each of the sub board connectors 27 has a plurality of male terminals (not shown in the drawing) protruding substantially perpendicularly from the upper surface of the sub board 21 and exposed from the upper reinforcement plate 23.

The enclosure 3 is substantially box-shaped and has a top plate 3a, a bottom plate 3b, a front plate 3c, and a pair of side slide plates 3d (not shown in the drawing), feet 39 being fixed to the lower surface of the bottom plate 3b. The main board block 5 (main board 13) is disposed substantially in parallel with the bottom plate 3b and at a position in greater proximity to the bottom plate 3b than to the top plate 3a, and it supported at both sides thereof by the slide plates 3d. By doing this, the main board block 5 divides the inside of the enclosure 3 into an upper housing part 29 and a lower housing part 31 acting as a sub board housing part. That is, the lower housing part 31 is portioned by the inner surfaces 35 of a pair of slide plates 3d, the upper surface of the bottom plate 3b (opposing inner surface of the enclosure 3) 37, and the lower surface of the lower reinforcement plate 17 of the main board block 5.

On the bottom part of the of the rear panel, which is one of the sides of the enclosure 3, is provided an aperture 33 providing an opening to the lower housing part 31, a sub board block 7 being inserted into the lower housing part 31 via this aperture. In the upper housing part 29 another plurality of sub boards (not shown in the drawing) is inserted from the top in an upright attitude.

One set of guide rails 9 and the link mechanism 11 are provided in mutual opposition on the inner surface 35 of the slide plate 3d of the enclosure 3 (inner surface of the enclosure 3), which partitions the side direction of the lower housing part 31, and the guide rails 9 are each supported by the enclosure 3 via the link mechanism 11. As shown in FIG. 4, each of the guide rails 9 has a rail base 9 disposed along the inner surface 35 of the side plate 3d, and a mating part 9b protruding toward the lower housing part 31 from the rail base 9a.

As shown in FIG. 4, between the upper reinforcement plate 23 and lower reinforcement plate 25 at the side edges 7a and 7b of the sub board block 7 is formed a mating groove 69 so as to permit free slide mating with the mating part 9b of the guide rails 9. As shown in FIG. 3, one end of the guide rail 9 is disposed in the vicinity of the aperture 33. On the other end of the guide rail 9 is formed a board rail stopper 9c, which by moving in a sliding manner along the guide rail 9 comes into contact with the sub board block 7 inserted into the lower housing part 31, thereby positioning the sub board block 7 (sub board 21) at a temporary attachment position.

The link mechanisms 11 causes the guide rail 9 to move up and down between a lower position (first position) shown in FIG. 1 and an upper position (second position) shown in FIG. 10. The two link mechanisms 11 are configured substantially symmetrically, and the description to follow with describe only one thereof, the description of the other being omitted.

As shown in FIG. 3, the link mechanism 11 is formed by a first link member 41, a second link member 43, a third link member 45, a fourth link member 47, an intermediate link member 49, a link limiter 51, and an operating arm 53. The first, second, third, and fourth link members 41, 43, 45, and 47 all have substantially the same lengths.

As shown in FIG. 8, one end (lower end) of the second link member 43 is rotatably linked by a pin 57 to the inner surface of the slide plate 3d, and the second link member 43 extends toward the main board block 5. One end (lower end) of the link member 41 is rotatably linked by a pin 55 between the second link member 43 and the aperture 33 to the inner surface of the side plate 3d, the second link member 41 extending toward the main board block 5. The other end (upper end) of the first link member 41 has rotatably linked to it by the pin 59 one end of the intermediate link member 49 and one end (lower end) of the third link member 45. The other end (upper end) of the second link member 43 has rotatably linked to it, via the pin 61, the other end of the intermediate link member 49 and one end (lower end) of the fourth link member 47. The other end (upper end) of the third link member 45 is rotatably linked via the pin 63 to the rail base 9a of the guide rail 9, and the other end (upper end) of the fourth link member 47 and one end of the link limiter 51 are rotatably linked to the rail base 9a of the guide rail 9 via the pin 65.

The distance between the pins 55 and 59, the distance between the pins 57 and 61, the distance between pins 59 and 63, and the distance between pins 61 and 65 all substantially equal. The distance between pins 55 and 57, the distance between pins 59 and 61, and the distance between pins 63 and 65 are all substantially equal. Additionally, the pins 55 and 57 are disposed on a straight line that is substantially parallel with the upper surface 37 of the bottom plate 3b and the main board 13. By adopting this arrangement, the intermediate link member 49 and the guide rail 9 move up and down substantially in parallel with the upper surface 37 of the bottom plate 3b and the main board 13.

The link limiter 51 extends from the guide rail 9 in a direction opposite from the aperture 33, and one end of the link limiter 51 is rotatably linked to the inner surface 35 of the slide plate 3d by a pin 67. The distance between the pins 65 and 67, and the position of the pin 67 are established so that the guide rail 9 moves up and down along a direction that is substantially perpendicular to the main board 13. That is, by the action of this link mechanism 11, the attitude and direction of movement of the guide rail 9 are restricted so that that they are maintained substantially parallel to the main board 13 as the guide rail 9 moves up and down substantially perpendicular to the main board 13.

As shown in FIG. 5 and FIG. 6, a link restricting mechanism 71 is provided on the inner surface 35 of the enclosure 3. The link restricting mechanism 71 has a base plate 73 and a cover plate 75. The base plate 73 is disposed between the inner surface 35 of the slide plate 3d and the intermediate link 49. The cover plate 75 formed by bending it from a single sheet of steel into a substantially hat-shaped form, this having a substantially U-shaped center part 77 and two flanges 79 which extend from the two edges thereof in mutually opposing directions. The flanges 79 of the cover plate 75 a superposed with the base plate 73, and are joined in a fixed manner to the base plate 73 and also to the slide plate 3d by a bolt 81. In this condition, the outer surface (first inner surface) of the base plate 73 and the inner surface (second inner surface) of the intermediate part 77 are in mutual opposition, with the intermediate link 49 inserted therebetween. As shown in FIG. 5, in substantially the center part of the base plate 73 a substantially L-shaped leaf spring (urging member) 83 is formed so as to be cut out of an protrude from the base plate 73. The intermediate link 49, which is inserted between the surface 73a of the base plate 73 and the inner surface 77a of the cover plate 75 is urged by the leaf spring 83 so as to come into contact with the inner surface 77a of the cover plate 75. By doing this, a fixed distance is maintained between the inner surface 35 of the slide plate 3d and the intermediate link 49.

As shown in FIG. 7 supporting walls 85 is formed as one on the surface of the first link member 41, along a direction that intersects the direction of extension of the first link member 41 substantially at a right angle. One end 53a of the operating lever 53 is disposed between the supporting walls 85, and is rotatably supported by a shaft 87 that links between the supporting walls 85. The shaft 87 is substantially perpendicular to the supporting walls 85, and the operating lever 53 is substantially perpendicular to the first link member 41. The operating lever 53 can be selectively set at an operating position (indicated in FIG. 7 by the solid line) in which it extends toward the aperture 33, and a stored position (indicated in FIG. 7 by the double dot-dashed line) in which it extends in a direction that is opposite from the aperture 33. As shown in FIG. 8 and FIG. 9, when the guide rail 9 is at a position other than the upper position, the operating lever 53 is basically set in the operating position and, as shown in FIG. 10, when the guide rail 9 is at the upper position, the operating lever 53 is at the stored position.

As shown in FIG. 8, when the guide rail 9 is at the lower position, the link members 41 and 45 linked by the pin 59 and the link members 43 and 47 linked by the pin 61 form substantial L shapes, with the pivot points formed by the pins 59 and 61 protruding in a direction opposite from the aperture 33, so that the guide rail 9 is separated by a prescribed distance from the lower reinforcement plate 17 of the main board block 5. Downward movement of the guide rail 9 below the lower position is blocked by the link limiter 51, the guide rail 9 being maintained at the lower position. In this condition, the operating lever 53 extends upward at an inclination from the first link member 41, passing through the aperture 33 to be exposed to the outside of the enclosure 3.

With the guide rail 9 at the lower position, the sub board block 7 is inserted into the lower housing part 31, and moves in a sliding manner along the guide rails 9, so that the end thereof comes into contact with the board rail stopper 9c, thereby performing positioning. By doing this, the sub board 21 is set at the temporary attachment position.

As shown in FIG. 9, when the other end 53b of the operating lever 53 is pushed downward, the action of the link mechanism 11 moves the guide rail 9 upward substantially vertically. More specifically, the first link member 41 and the third link member 45 are gradually lifted upright, and the second link mechanism 11 43 and the fourth link member 47, which are linked via the intermediate link member 49 are lifted upright in concert, in accompaniment with which the guide rail 9 rises substantially in parallel. The reason that the guide rail 9 rises substantially parallel, is that distance between pins 67 and 65 is maintained substantially the same by the link limiter 51, thereby restricting the direction of movement of the pin 65.

As shown in FIG. 10, when the guide rail 9 either reaches or slightly passes the upper position, the edge 47a of the fourth link member 47 comes into contact with the edge 77a of the intermediate part 77 of the cover plate 75, thereby blocking movement of the fourth link member 47 and setting the guide rail 9 at the upper position. Accompanying the movement of the guide rail 9, the sub board 21 supported by the guide rails 9 moves from the temporary attachment position to the fully attached position, at which the sub board connector 37 mates with the main board connector 19.

As shown in FIG. 10, with the guide rail 9 having reached the upper position, the link members 41 and 45, linked by the pin 59, and the link members 43 and 47, linked by pin 61, form a substantial straight line, the operating lever 53 being substantially parallel o the upper surface 37 of the bottom plate 3b.

As shown in FIG. 4 and FIG. 8 to FIG. 10, a guide hole 89 is formed in the sub board block 7, and a guide protrusion 91 which mates with the guide hole 89 when the sub board 21 moves completely to the fully attached position is formed so as to protrude upward at a position on the lower surface of the lower reinforcement plate 17 of the main board block 5. By the guide protrusion 91 being inserted into this guide hole 89, the sub board 21 is guided to a position at which the sub board connector 27 mates with the main board connector 19. Thus, the guide hole 89 and the guide protrusion 91 form an insertion guide mechanism. A tapered part 91a for the purpose of smoothly guiding the guide protrusion 91 into the guide hole is formed at the lower end of the guide protrusion 91.

As shown in FIG. 7, a magnet 93 is affixed to the inner surface of the other end 53b of the operating lever 53. A lever restricting protrusion 95 is fixed to the inner surface 35 of the slide plate 3d of the enclosure 3. When the guide rail 9 (shown in FIG. 10) reaches the upper position, and the operating lever 53 is in a condition in which it is substantially parallel to the upper surface 37 of the bottom plate 3b, if the operating lever 53 is moved from the operating position (solid line in FIG. 7) to the stored position (double-dot dashed line in FIG. 7), the magnet 93 sticks to the surface of the flange 79 on the lower side of the cover plate 75, so that rotational movement of the operating lever 53 about the shaft 87 is blocked. In this condition, downward movement of the other end 53b of the operating lever 53 is blocked by the upper surface 95a of the lever restricting protrusion 95. Therefore, movement of the operating lever 53 at the stored position is restricted by the magnet 93, the lower surface 77b of the intermediate part 77 of the cover plate 75, and the upper surface 95a of the lever restricting protrusion 95. That is, the magnet 93, the lower surface 77b, and the upper surface 95a form a lever holding mechanism, which holds the operating lever in the stored position when the guide rail 9 is at the upper position, and which blocks the movement of the operating lever 53 along the inner surface 35.

As shown in FIG. 12, two auxiliary insertion mechanisms 97, for pressing an intermediate part of the sub board 21 at the fully attached position toward the main board block 5, and causing the sub board connector 27 (shown in FIG. 2) disposed at the intermediate part to mate fully with the main board connector 19, are provided on the bottom plate 3b of the enclosure 3.

As shown in FIG. 3, each of the auxiliary insertion mechanisms 97 has a frame 99, a base 101, a bolt 103, and a bolt hole 105. A housing hollow part 37a is formed in the upper surface 37 of the bottom plate 3b. A protruding part 107 rotatably supported by the opposing wall of the hollow part 37a is formed as one therewith. By the base 101 rotating relative to the upper surface 37 about the protruding part 107 as a center, setting is does selectively between a reclining position (double-dot dashed line in FIG. 12) substantially parallel with the upper surface 37 and an upright position (solid line in FIG. 12) substantially perpendicular to the upper surface 37. The bolt 103 extends as one with from the other end 101b of the base 101, and screws into a bolt hole 105 formed in one end 99a of the frame 99. On the other end 101b of the frame 101 is formed as one therewith a protrusion 109, which protrudes toward the sub board block 7 with the base 101 is in the upright position. A depression 111, which accepts the protrusion 109, is formed on the lower surface of the lower reinforcement plate 25 of the sub board block 7. With the base 101 in the upright condition, by the frame 99 being caused to rotate in the forward direction relative to the base 101 (bolt 103), the frame 99 moves downward, and by the frame 99 being caused to rotate in the reverse direction relative to the base 101 (bolt 103), the frame 99 moves upward. By setting the base 101 into the upright condition and causing the frame 99 to rotate in the reverse direction so as to raise the frame 99, the protrusion 109 of the frame 99 is inserted into the depression 111 of the sub board block 7, so that the sub board block 7 is pressed toward the main board block 5. With the frame 99 rotated in the forward direction so as to bring it near to the base 101, if the base 101 is rotated from the upright position to the reclining position, the frame 99, the base 101, and the bolt 103 fit into the housing hollow part 37a.

As shown in FIG. 14 and FIG. 15, with the guide rail 9 held at the upper position, the sub board 21 held at the fully attached position, and the operating lever 53 held at the housed position, a power supply unit 113 is inserted into the lower housing part 31 via the aperture 33. A unit cover plate 113a is mounted to one end of the power supply unit 113, and the bolts 115 at the top and bottom parts of the unit cover plate 113a hold the power supply unit respectively to the lower reinforcement plate 25 of the sub board 21 and to the bottom plate 3b of the enclosure 3.

Link Mechanism Action

FIG. 11 shows in schematic form the condition of the link mechanism 11 in the case in which the guide rail 9 is at the lower position (double-dot dashed line in the drawing), the case in which the guide rail 9 is at an intermediate position (solid line in the drawing), and the case in which the guide rail 9 is at the upper position (the single-dot dashed line). At the intermediate position, the mating starts between the sub board connector 27 and the main board connector 19 (refer to FIG. 9 for these connectors).

The relationship existing between the force Fd acting downward on the other end 53b of the operating lever 53 and the propelling force Fq developed in the link mechanism 11 (force pushing the guide rail 9 upward) is $$Fq = k \times Fd \times \cos\theta/2 \tan\theta \quad (1)$$

In the above relationship, k is L/r, L is the distance between the point of action of the force Fd pushing the operating lever 53 downward and the first link member 41, r is the effective length of the first link member 41 (distance between pins 55 and 59), and $\theta$ is the inclination of the operating lever 53 relative to the horizontal direction.

In this embodiment, L/r is set to be 3.0. In the case in which the guide rail 9 is at the lower position (double-dot dashed line in the drawing) the value of $\theta$ is set to 38.5°. If these conditions are substituted into Equation (1), Fq=1.48 Fd, indicating that a propelling force approximately 1.5 times the downward pushing force is obtained. Under these conditions, because the connectors have not yet mated, the propelling force of approximately 1.5 times the downward pushing force can easily raise the sub board block 7.

When the guide rail 9 is at the intermediate position (solid line in the drawing), the value of $\theta$ is set to 22.8°. If this condition is substituted into Equation (1), Fq=3.29 Fd, indicating that a propelling force of approximately 3.3 times the downward pushing force is obtained. That is, a propelling force that is approximately 3.3 times the downward pushing force starts the mating between the connectors.

When the guide rail 9 is at the upper position (single-dot dashed line in the drawing), the theoretical value of $\theta$ is 0°, and if this condition is substituted into Equation (1) Fq is infinite, this being unrealistic. For this reason, if the value of $\theta$ is made 5°, the result is Fq=17.1 Fd, meaning that a propelling force of approximately 17.1 times the downward pushing force is obtained.

In this manner, the link mechanism 11 operates as a so-called toggle mechanism, enabling a small downward pushing force to generate a large propelling force. Near the top position, where a particularly large mating force is required between the connectors, it is possible to obtain a large propelling force. It is therefore easy to insert and remove the sub board 21 with a small force.

Insertion and Removal of the Sub Board

When the sub board block 7 (sub board 21) is to be installed, the guide rail 9 is set at the lop, and the sub board block 7 is inserted into the lower housing part 31 from the aperture 33 as the mating part 9b of the guide rail 9 is inserted into the mating groove 69 of the sub board block 7. When the sub board block 7 reaches the temporary attachment position, the forward inserted edge of the sub board block 7 comes into contact with the board rail stopper 9c, thereby positioning the sub board 21 at the temporary attachment position.

Once the sub board 21 has reached the temporary attachment position, the two operating levers 53 are pressed downward substantially at the same time. By doing this, the action of the link mechanism 11 causes the guide rail 9 to move toward the lower position, the sub board 21 supported by the guide rail 9 moving from the temporary attachment position to the fully attached position, and the sub board connector 27 mating with the main board connector 19. When this occurs, the edge 47a of the fourth link member 47 comes into contact with the edge 77a of the intermediate part 77 of the cover plate 75, so that the operating lever 53, which has moved as far as the substantially horizontal position, is prevented from being pushed farther downward, the guide rail 9 being set at the upper position.

During the rise of the sub board block 7, before the start of the mating of sub board connector 27 with the main board connector 19, the guide protrusion 91 of the main board block 5 is inserted into the guide hole 89 of the sub board block 7, and the sub board 21 is properly guided to the position at which the sub board connector 27 mates with the main board connector 19. For this reason, it is possible for the sub board connector 27 to achieve a good and reliable mating with the main board connector 19.

When the sub board block 7 is inserted and when the operating lever 53 is operated, the intermediate link 49 is urged by the leaf spring 83 so as to come into contact with the guide plate 75, so that a fixed distance is maintained between the inner surface 35 of the slide plate 3d and the intermediate link 49. For this reason, the relative distance between the two guide rails 9 is maintained, and the sub board block 7 is supported by the guide rails 9.

When the center part of the sub board 21 at the fully attached position flexes downward, there is a large possibility of an insufficient mating between or a so-called "floating condition" occurring between the sub board connector 27 at this center part and the corresponding sub board connector 19. To solve this problem, the base 101 at the reclined position is set to the upright position, and the frame 99 is rotated in the reverse direction relative to the base 101 (bolt 103) so as to raise it, the protrusion 109 of the frame 99 being matched with the depression and further rotation being done so that the protrusion 101 pushes the depression 111 (sub board 21) toward the main board block 5. When the flexing (floating) of the sub board 21 is visually verified as having been removed, the frame 99 is caused to rotate in the forward direction, causing it to move towards the base 101, and the base 101 is caused to rotate from the upright position to the reclining position, resulting in the frame 99, the base 101, and the bolt 103 being housed within the housing hollow part 37a.

Once the mating of the sub board connector 27 and the main board connector 19 has been completed, the operating lever 53 at the operating position is caused to rotate toward the stored position. Movement of the operating lever 53 at the stored position is prevented by the magnet 93, the lower surface 77b of the center part 77 of the cover plate 75, and the upper surface 95a of the lever restricting protrusion 95, and the sub board 21 (sub board block 7) supported by the guide rail 9 is held in the fully mated position.

Finally, a power supply unit 113 is inserted into the lower housing part 31 via the aperture 33, and tightened in place by the bolt 115.

To remove the sub board block 7 (sub board 21), the bolt 115 is removed, the power supply unit 113 is removed from the lower housing part 31, and the operating lever 53 is pushed upward, so as to rotate the operating lever 53 from the stored position to the operating position. By doing this, the guide rail 9 moves from the upper position to the lower position, and the sub board connector 27 is removed from the parent board connector 19, the sub board block 7 (sub board 21) being moved from the fully mated position to the temporary attachment position. Then the sub board block 7 (sub board 21) is finally pulled out from the aperture 33.

According to this embodiment of the present invention, therefore, it is possible to easily and reliably perform the tasks of inserting and removing a sub board 21 substantially parallel to the main board 13, without requiring excessive force.

Because both the link mechanism 11 and the auxiliary insertion mechanism 97 are mounted so that they can be freely housed in the enclosure 3, it is possible to easily insert and remove a sub board 21 at the location in which the electronic equipment 1 is used, thereby facilitating maintenance and the like.

Additionally, because the power supply unit 113 inserted into the lower housing part 31 is tightened into place by the bolt 115 relative to the lower reinforcement plate 25 and the bottom plate 3b of the enclosure 3, the mounting structure of the power supply unit 113 is simplified, thereby simplifying the overall construction of the enclosure 3.

It will be understood that the present invention is not restricted to the above-described embodiment, and can be the subject of various modifications and design changes, within the scope of the technical concept of the present invention, even if these are different from the above-noted embodiment.

For example, although the foregoing embodiment is described for a case in which the sub board 21 rises substantially perpendicularly from the bottom relative to the main board 13, there is no restriction with regard to the direction of insertion and removal, as long as the sub board 21 and the main board 13 are substantially parallel. Additionally, it is possible to apply the present invention in a case in which a sub board is inserted in a location with tight quarters, making insertion by hand is difficult, or in a location in which there is a component that should not be touched by the hand, or in a case in which a sub board is used but in which it is difficult to provide space for screwing in.

According to the present invention as described in detail above, it is possible to easily perform insertion and removal of a sub board disposed substantially in parallel with a main board, without requiring excessive force.

What is claimed is:

1. An electronic equipment comprising:
   an enclosure defining a sub board housing part;
   a main board fixed relative to the enclosure;
   a first connection part fixed relative to the main board and facing the sub board housing part;
   a sub board disposed opposite the main board at a temporary attachment position;
   a second connection part fixed relative to the sub board, the second connection part, by the sub board at the temporary attachment position moving toward the main board and reaching a fully attached position, mating and connecting with the first connection part;
   a guide provided so as to freely move between a first position and a second position within the sub board housing part, the guide, by moving from the first position to the second position, causing the sub board to move from the temporary attachment position to the fully attached position, and the guide at the second position holding the sub board at the fully attached position; and
   a guide movement mechanism linked to the guide, the guide movement mechanism being driven so as to operate to move the guide from the first position to the second position.

2. The electronic equipment according to claim 1, wherein
   the sub board is disposed at the temporary attachment position in opposition to the main board and substantially in parallel therewith, and
   the guide at the first position guides the sub board toward the temporary attachment position in a condition substantially parallel to the main board and, by moving from the first position to the second position, causes the sub board to move in a direction substantially perpendicular to the main board.

3. The electronic equipment according to claim 1, wherein the guide movement mechanism comprises
   a first link member, one end of which being rotatably supported relative to the enclosure,
   a second link member, one end of which being rotatably supported relative to the enclosure,
   an intermediate link member, both ends of which being rotatably linked to the other ends of the first link member and the second link member, and a third link member, one end of which being rotatably linked to the other end of the first link member, and another end of which being rotatably linked to the guide, and a fourth link member, one end of which being rotatably linked to the other end of the second link member, and another end of which being rotatably linked to the guide.

4. The electronic equipment according to claim 1, wherein the enclosure has at least one aperture, the sub board is inserted toward the temporary attachment position within the sub board housing part from the aperture, and the guide at the first position guides the sub board to the temporary attachment position.

5. The electronic equipment according to claim 4, further comprising:

a first reinforcement plate and a second reinforcement plate, which surround and hold the sub board from both front and rear sides, and which, together with the sub board, form a sub board block, wherein the enclosure comprises a pair of inner side surfaces in mutual opposition to one another, which define the sub board housing part, the guide is formed by a pair of mutually opposing guide rails formed on the pair of inner side surfaces, the guide rails slidably mating with edges on both sides of the sub board block and guiding the sub board block toward the temporary attachment position, the guide movement mechanism comprises a pair of link mechanisms corresponding to the pair of guide rails, each of the link mechanisms comprises first, second, third, and fourth link members, an intermediate link member, and a link limiter, the second link member comprises one end rotatably linked to the inner side surface of the enclosure, and extends toward the main board from the one end, the first link member comprises one end rotatably linked to the inner side surface of the enclosure between the second link member and the aperture, and extends from the one end toward the main board substantially in parallel with the second link member, the two ends of the intermediate link member are rotatably linked to the other ends of the first link member and the second link member, the third link member comprises one end rotatably linked to the other end of the first link member and another end rotatably linked to the guide rail, the fourth link member comprises one end rotatably linked to the other end of the second link member and another end rotatably linked to the guide rail, and the link limiter comprises one end rotatably linked to the guide rail and another end rotatably linked to the enclosure, the link limiter limiting movement of the guide in a prescribed direction.

6. The electronic equipment according to claim 5, further comprising:

an insertion guide mechanism, which, when the sub board moves from the temporary attachment position toward the fully attached position, guides the sub board to a position at which the second connection part mates with the first connection part.

7. The electronic equipment according to claim 6, further comprising:

third and fourth reinforcement plates, which surround and hold the main board from both front and rear sides, and which, together with the main board, form a main board block, wherein the insertion guide mechanism is provided with a guide hole on one of the sub board block and the main board block, and a guide protrusion on the other of the sub board block and the main board block for positioning the sub board relative to the main board block by being inserted into the guide hole when the sub board is moved to the fully mated position.

* * * * *